(12) United States Patent
MacDonald et al.

(10) Patent No.: US 9,777,380 B2
(45) Date of Patent: Oct. 3, 2017

(54) MULTI-LAYERED 3D PRINTED LASER DIRECT STRUCTURING FOR ELECTRICAL INTERCONNECT AND ANTENNAS

(71) Applicant: Board of Regents, The University of Texas System, Austin, TX (US)

(72) Inventors: Eric MacDonald, El Paso, TX (US); David Espalin, El Paso, TX (US); Ryan Wicker, El Paso, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/202,936

(22) Filed: Jul. 6, 2016

(65) Prior Publication Data

US 2017/0013712 A1 Jan. 12, 2017

Related U.S. Application Data

(60) Provisional application No. 62/189,463, filed on Jul. 7, 2015.

(51) Int. Cl.
| | | |
|---|---|---|
| H05K 1/11 | (2006.01) |
| C23C 18/16 | (2006.01) |
| B29C 67/00 | (2017.01) |
| H05K 3/10 | (2006.01) |
| H05K 3/42 | (2006.01) |
| B29L 31/34 | (2006.01) |

(52) U.S. Cl.
CPC ...... *C23C 18/1641* (2013.01); *B29C 67/0066* (2013.01); *C23C 18/1608* (2013.01); *C23C 18/1612* (2013.01); *H05K 3/105* (2013.01); *H05K 3/422* (2013.01); *B29K 2995/0006* (2013.01); *B29L 2031/3425* (2013.01); *H05K 3/426* (2013.01); *H05K 3/429* (2013.01); *H05K 2203/072* (2013.01); *H05K 2203/0759* (2013.01); *H05K 2203/107* (2013.01)

(58) Field of Classification Search
CPC .... H05K 1/11; H05K 3/4076; B29C 67/0066; C23C 18/1608; C23C 18/1612
USPC .......................... 174/250, 251, 255–258, 262
See application file for complete search history.

(56) References Cited

U.S. PATENT DOCUMENTS

| | | |
|---|---|---|
| 7,419,630 B2 | 9/2008 | Palmer et al. |
| 8,177,348 B2 | 5/2012 | Sidhu et al. |
| 8,314,027 B2 | 11/2012 | Thie et al. |
| 8,393,918 B2 | 3/2013 | Cheng et al. |
| 8,617,987 B2 | 12/2013 | Gan et al. |
| 8,816,019 B2 | 8/2014 | Ganguly et al. |

(Continued)

OTHER PUBLICATIONS

Three-dimensional circuits with LDS, Laser Direct Structuring and Metallization for 3D Mechatronic Integrated Devices, LaserMicronics Micromaching Services, 16 pages.

(Continued)

*Primary Examiner* — Tremesha S Willis
(74) *Attorney, Agent, or Firm* — Kermit D. Lopez; Luis M. Ortiz; Ortiz & Lopez, PLLC

(57) ABSTRACT

A multi-layered 3D printed laser direct structuring method and apparatus for electrical interconnect and antennas. 3D printed components can be configured with structurally integrated metal connections (e.g., bulk highly conductive metal) that traverse multiple layers (some embedded and others external) of a structure fabricated using an additive manufacturing system enhanced with an iterative laser activated plating processes, which includes a novel well sidewall vertical interconnect.

20 Claims, 2 Drawing Sheets

(56) References Cited

U.S. PATENT DOCUMENTS

| | | |
|---|---|---|
| 8,828,311 B2 | 9/2014 | Medina et al. |
| 8,974,869 B2 | 3/2015 | Hamilton et al. |
| 9,067,238 B2 | 6/2015 | Hamilton et al. |
| 9,074,070 B2 | 7/2015 | Yung et al. |
| 2014/0268604 A1 | 9/2014 | Wicker et al. |
| 2014/0268607 A1 | 9/2014 | Wicker et al. |

OTHER PUBLICATIONS

Heininger, N. et al., "Manufacturing of Molded Interconnect Devices from Prototyping to Mass Production with Laser Direct Structuring," Proceedings of the 6th International Congress Molded Interconnect Devices (2004) Erlangen, pp. 157-178.

Gries, D., "Photonics Applied: Microelectronics Processing: Laser direct structuring creates low-cost 3D integrated circuits," LaserFocusWorld (2010) Oct. 1, 7 pages.

Molded interconnect device—Wikipedia, the free encyclopedia, printed Jun. 8, 2016, 3 pages.

MULTI-LAYERED 3D PRINTED LASER DIRECT STRUCTURING FOR ELECTRICAL INTERCONNECT AND ANTENNAS

CROSS-REFERENCE TO PROVISIONAL APPLICATION

This nonprovisional patent application claims the benefit under 35 U.S.C. §119(e) of U.S. Provisional Patent Application Ser. No. 62/189,463 filed on Jul. 7, 2015, entitled "Multi-Layered 3D Printed Laser Direct Structuring for Electrical Interconnect and Antennas," which is hereby incorporated by reference in its entirety.

TECHNICAL FIELD

Embodiments are related to the manufacture of 3D printed components with structurally integrated metal connections (e.g., bulk highly conductive metal) that traverse multiple layers (some embedded and others external) of a structure fabricated using an additive manufacturing system enhanced with an iterative plating processes. Embodiments are further related to the manufacture of 3D printed structures including internal cavities using an extrusion-based additive manufacturing system or any other plastic-based LDS-compatible additive manufacturing enhanced with high density routing of highly conductive electrical interconnect on multiple internal and external layers and surfaces.

BACKGROUND

The next generation of manufacturing technology will require complete spatial control of material and functionality as structures are created layer-by-layer, thereby providing fully customizable, high value, multi-functional products for the consumer, biomedical, aerospace, defense, and other industries. With contemporary Additive Manufacturing (AM—also known more popularly as 3D printing) providing the base fabrication process, a comprehensive manufacturing suite will be integrated seamlessly to include: 1) printing of a wide variety of robust plastics/metals; 2) micromachining; 3) laser direct structuring on multiple layers and in between layers; 4) embedding of wires, metal surfaces, and fine-pitch meshes submerged within the plastics; 5) micro-dispensing; and 6) robotic component placement. Paramount to this concept is high density routing (e.g., <200 micron spacings and widths) of highly conductive antennas and electrical interconnect between components incorporated within arbitrarily formed 3D printed dielectric structures.

Some 3D manufacturing systems print with LDS (Laser Direct Structure) materials that allow a laser to selectively activate a surface of the plastic printed structure for subsequent electroless plating of a metal onto the plastic surface. This has been accomplished traditionally for plastic injection molding and recently by Stratasys Ltd. with a recently announced filament with the activation capability. To date, however, this technique has been limited to the external surfaces after completion of the injection molding or 3D printing.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for the manufacture of 3D printed components with structurally integrated metal connections.

It is another aspect of the disclosed embodiments to provide for the manufacture of 3D printed components with structurally integrated metal connections that traverse multiple layers (e.g., some embedded and others external) of a structure fabricated using an additive manufacturing system enhanced with an iterative plating processes.

It is still another aspect of the disclosed embodiments to provide for the manufacture of 3D printed structure including internal cavities using an extrusion-based additive manufacturing system or any other plastic-based LDS-compatible additive manufacturing enhanced with high density routing of highly conductive electrical interconnect on multiple internal and external layers and surfaces.

The aforementioned aspects and other objectives and advantages can now be achieved as described herein. An apparatus and a method of making a three-dimensional electronic or electromechanical component/device (the apparatus) is disclosed. Example embodiments can include processing steps or operations for creating with a 3D printer at least two layers of a three-dimensional substrate of a structure activated by a laser, selectively activating via the laser traces of electrical interconnect with respect to the structure, electrolessly plating the dielectric structure to provide a new electrical interconnect that is highly conductive and densely routed, re-inserting the structure with registration into the 3D printer, depositing additional dielectric with a majority of the new electrical interconnect covered and embedded, but with at least some of the new electrical interconnect exposed at a bottom of at least one well having side-walls, and activating the side-walls of the well and providing a connection between the two (or more) layers. The aforementioned structure preferably is composed of a dielectric material or dielectric structure. Additionally, the connection between the two layers can be provided after a subsequent electroless plating operation. Activation of the side walls of the well can be facilitated by the laser discussed herein or similar types lasers.

The disclosed example embodiments involve the manufacture of 3D printed components with structurally integrated metal connections (e.g., bulk highly conductive metal) that can traverse multiple layers (e.g., some embedded and others external) of a structure fabricated utilizing an additive manufacturing system/apparatus enhanced with iterative laser activated plating processes and which includes a novel well side-wall vertical interconnect.

The disclosed example embodiments cover the manufacture of 3D printed structures including internal cavities using an additive manufacturing system enhanced with high density routing of highly conductive electrical interconnect on multiple internal and external layers and surfaces. The unique AM (Additive Manufacturing) approach discussed herein allows for the creation of a dense layer of interconnect on a fabricated structure with continued building of more plastic, which (1) embeds the majority of the interconnect between the previous dielectric structure and the new dielectric structure and (2) provides access to some of the interconnect through relatively low-aspect-ratio wells.

A laser can subsequently activate the side of the well and continue the interconnect on the top surface of the next layer. The process can be repeated as often as necessary to provide any number of layers of interconnect that are connected vertically through these novel well side-wall connections by repeated fabrication using additive manufacturing, performing laser activation of the routing layers linking layers through the side-walls, and then electrolessly plating the structure.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
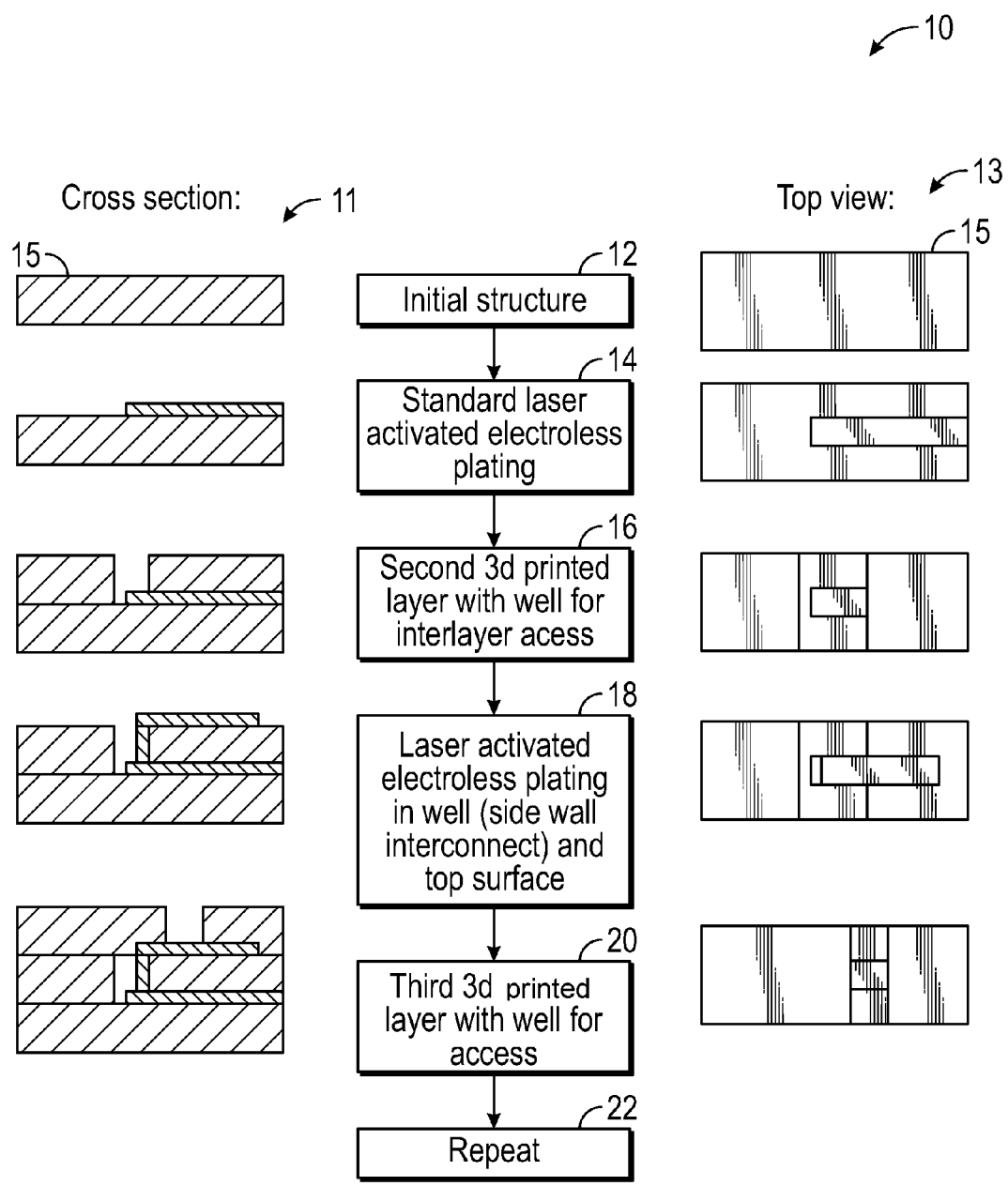
FIG. 1 illustrates process steps for configuring two layers via an LDS based 3D printing process with materials extrusion (or any other plastics based additive manufacturing that is compatible with LDS), in accordance with a preferred embodiment.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to identical, like or similar elements throughout, although such numbers may be referenced in the context of different embodiments. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosed example embodiments relate to 3D printing, additive manufacturing, layer manufacturing, rapid prototyping, layer-wise fabrication, solid freeform fabrication, and direct digital manufacturing. Note that other terms can be used synonymously to refer to 3D printing include additive manufacturing, layer manufacturing, rapid prototyping, layer-wise fabrication, solid freeform fabrication, and direct digital manufacturing type of additive manufacturing (AM)

The disclosed example embodiments further relate to the manufacture of 3D printed structures including internal cavities using an additive manufacturing system enhanced with high density routing of highly conductive electrical interconnect on multiple internal and external layers and surfaces. A unique AM (Additive Manufacturing) approach is disclosed, which can allow for the creation or manufacturing of a dense layer of interconnect on a fabricated structure with continued building of more plastic, which (1) embeds the majority of the interconnect between the previous dielectric structure and the new dielectric structure and (2) provides access to some of the interconnect through relatively low-aspect-ratio wells. A laser can subsequently activate the side of the well and continue the interconnect on the top surface of the next layer.

This process can be repeated as often as necessary to provide any number of layers of interconnect that are connected vertically through these novel well side-wall connections by repeated fabrication using additive manufacturing, performing laser activation of the routing layers linking layers through the side-walls, and then electrolessly plating the structure.

Note that as utilized herein, the term LDS refers to "Laser Direct Structuring" or "Laser Direct Structure." The LDS process generally involves the use of a computer-controlled laser beam that travels over a substrate or a particular portion of a substrate to activate its surface at locations where, for example a conductive path is to be situated with a laser direct structuring process, it is possible to obtain conductive element widths and spacings of, for example, 150 microns or less with bulk thicknesses, for example, around 30-40 microns similar to a traditionally plated printed circuit board.

The LDS process in some example embodiments can utilize a thermoplastic material, doped with a metal-plastic additive activated by means of laser. The basic component is single-component injection molded with practically no restrictions in terms of 3D design freedom. A laser then writes the course of the later circuit trace on the plastic. Where the laser beam hits the plastic, the metal additive forms a micro-rough track. The metal particles of this track form the nuclei for the subsequent metallization. In an electroless copper bath, the conductor path layers arise precisely on these tracks. Successively layers of copper, nickel, and gold finish can be raised in this way. The LDS process implemented in accordance with an example embodiment can be characterized by: single-component injection molding, a wide range of materials is available, full three-dimensionality in a sphere flexibility (for a changed routing of traces, only new control data have to be transmitted to the laser unit). Thus, different functional components can be produced from one basic unit. The LDS process can also be characterized by precision. For example, finest conductor paths with a diameter of <80 µm are possible.

FIG. 1 illustrates processing steps for configuring two (or more) layers via an LDS ("Laser Direct Structuring" or "Laser Direct Structure") based 3D printing method 10 with materials extrusion or any other plastic-based LDS-compatible additive manufacturing, in accordance with a preferred example embodiment. FIG. 1 depicts a multi-layer interconnect process with repeated 3D printing and laser activated electroless plating (e.g., LDS). A cross-sectional view 11 and a top view 13 of the method/process 10 are shown in FIG. 1. As indicated at step 12, a structure (e.g., a dielectric structure) 15 is provided. Then, as depicted at step 14, a standard laser activated electroplating operation can be implemented with respect to the structure.

Thereafter, as illustrated at step 16, an operation can be implemented in which a second 3D printed layer is configured with a well for interlayer access. Next, as shown at step 18, an operation can be implemented involving laser activated electroless plating in the well (e.g., side wall interconnect) and top surface. Then, as illustrated at step 20, a third 3D printed layer can be configured with the well for access. The process can then be repeated as necessary, as shown at block 22.

FIG. 1 thus shows an example process for the manufacture of a 3D printed structure utilizing LDS in a novel multiple layered method as opposed to being limited to the external surface only. First, 3D printing can be utilized to build layers of dielectric structure of material that can be activated by a laser. A laser can then selectively activate the traces of electrical interconnect. The structure can be electrolessly plated to provide highly conductive and densely routed electrical interconnect.

The structure can be re-inserted with registration into the 3D printer and more dielectric is deposited with a majority of the new interconnect covered and embedded, but with some left exposed at the bottom of wells. The laser can then be used to activate the side-walls of the well and then continuing along the top surface of the new structure and consequently providing a connection between layers after subsequent electroless plating process. The LDS processing can be confined to just the side walls if other planar electrical interconnect processes are preferred on the horizontal surfaces such as embedding wire directly into the structure which has the side benefit of improving the mechanical properties of the structure.

It can be appreciated that at least some of the disclosed embodiments involve LDS processing, and additionally LDS processing with 3D printing. The disclosed embodiments allow interruption of the process, wherein densely routed metal traces are added, and then return to the 3D printer. This feature can be repeated many times. By repeatedly interrupting a 3D printer, layers of traces and many dielectric layers can be enabled.

Figure 2:
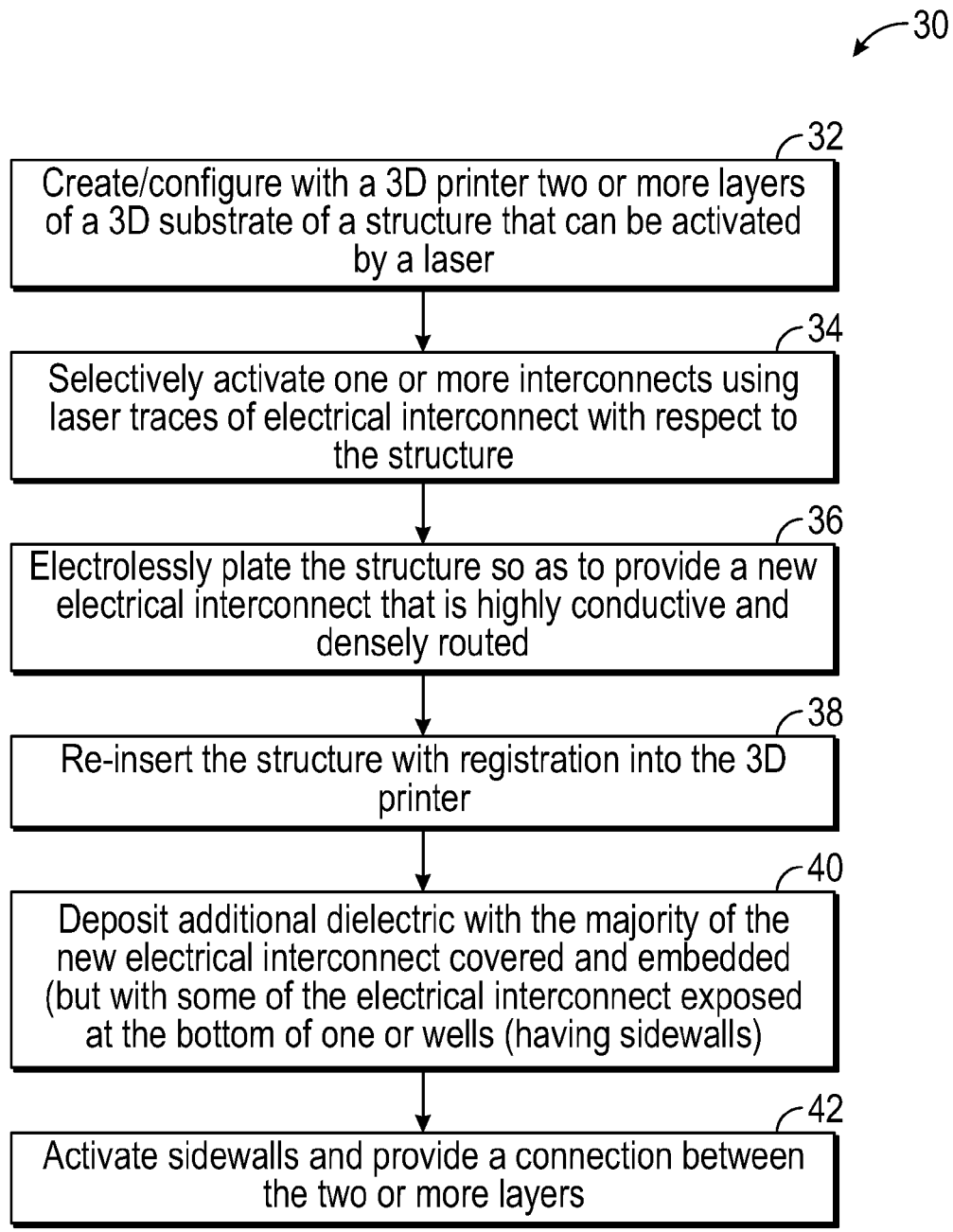
FIG. 2 illustrates a flow chart of operations depicting logical operational steps of a method of making/manufacturing a three-dimensional electronic or electromechanical component/device, in accordance with an example embodiment.

FIG. 2 illustrates a flow chart of operations depicting logical operational steps of a method 30 of making/manufacturing a three-dimensional electronic or electromechanical component/device, in accordance with an example embodiment. As depicted at block 32, a step or operation can be implemented for creating/configuring with a 3D printer, two or more layers of a three-dimensional substrate of a structure (e.g., a dielectric structure) activated by a laser. Thereafter, as depicted at block 34, a step or operation can be implemented to selectively activate one or more interconnects (e.g., a horizontal interconnect, a vertical interconnect, a horizontal interconnect and a vertical interconnect) utilizing the laser traces of the electrical interconnect with respect to the aforementioned structure.

Then, as illustrated at block 36, a step or operation can be provided of electrolessly plating the structure to provide a new electrical interconnect that is highly conductive and densely routed. Thereafter, as depicted at block 38, a step or operation can be provided for re-inserting the structure with registration into the 3D printer. Next, as depicted at block 40, a step or operation can be implemented to deposit an additional dielectric with a majority of the new electrical interconnect covered and embedded, but with at least some of the new electrical interconnect exposed at the bottom of at least one well (i.e., one or more wells) having sidewalls. Then, as depicted at block 42, a step or operation can be processed to activate the sidewalls of the well or wells and provide a connection between the aforementioned two or more layers.

Based on the foregoing, it can be appreciated that a number of embodiments, preferred and alternative, are disclosed herein. For example, in one embodiment a method is disclosed for making a three-dimensional electronic or electromechanical component/device. Such a method can involve steps or logical operations for creating with a 3D printer at least two layers of a three-dimensional substrate of a structure activated by a laser; selectively activating a horizontal and vertical interconnect using the laser traces of electrical interconnect with respect to the structure; electrolessly plating the structure to provide a new electrical interconnect that is highly conductive and densely routed; re-inserting the structure with registration into the 3D printer; depositing additional dielectric with a majority of the new electrical interconnect covered and embedded, but with at least some of the new electrical interconnect exposed at a bottom of at least one well having sidewalls; and activating the sidewalls of the well (or wells) and providing a connection between the two (or more) layers.

In some embodiments, the aforementioned structure may be a dielectric structure. In another embodiment, the connection between the two (or more) layers can be provided after a subsequent electroless plating operation. In still another embodiment, the step or operation of activating the side-walls of the well (or wells) can further include a step or operation for activating the side-walls of the well (or wells) with the laser.

In another embodiment, a three-dimensional electronic or electromechanical apparatus can be implemented which includes, for example: two or more layers of a three-dimensional substrate of a structure activated by a laser, the two (or more) layers created with a 3D printer; a horizontal and vertical interconnect selectively activated using the laser traces of electrical interconnect with respect to the structure; a new electrical interconnect that is highly conductive and densely routed, the new electrical interconnect provided by electrolessly plating the structure, wherein the structure is re-inserted with registration into the 3D printer; an additional dielectric deposited with a majority of the new electrical interconnect covered and embedded, but with at least some of the new electrical interconnect exposed at a bottom of at least one well having sidewalls; and wherein the sidewalls of the well (or wells) are activated and a connection provided between the two (or more) layers.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A method of making a three-dimensional electronic or electromechanical component/device, said method comprising: configuring with a 3D printer at least two layers of a three-dimensional substrate of a structure activated by a laser; selectively activating at least one interconnect utilizing traces of said at least one interconnect by said laser with respect to said structure; electrolessly plating said structure to provide a new electrical interconnect that is highly conductive and densely routed; re-inserting said structure with registration into said 3D printer; depositing an additional dielectric with a majority of said new electrical interconnect covered and embedded, but with at least some of said new electrical interconnect exposed at a bottom of at least one well having sidewalls; and activating said sidewalls of said at least one well and providing a connection between said at least two layers.

2. The method of claim 1 wherein said at least one interconnect comprises a horizontal interconnect.

3. The method of claim 1 wherein said at least one interconnect comprises a vertical interconnect.

4. The method of claim 1 wherein said at least one interconnect comprises a horizontal interconnect and a vertical interconnect.

5. The method of claim 1 wherein said structure comprises a dielectric structure.

6. The method of claim 1 wherein said connection between said at least two layers is provided after a subsequent electroless plating operation.

7. The method of claim 1 wherein activating said sidewalls of said at least one well, further comprises activating said sidewalls of said at least one well with said laser.

8. A three-dimensional electronic or electromechanical apparatus, comprising: at least two layers of a three-dimensional substrate of a structure activated by a laser, said at least two layers created with a 3D printer; at least one interconnect selectively activated using traces of said at least one interconnect by said laser with respect to said structure; a new electrical interconnect that is highly conductive and densely routed, said new electrical interconnect provided by electrolssly plating said structure, wherein said structure is re-inserted with registration into said 3D printer; an additional dielectric deposited with a majority of said new electrical interconnect covered and embedded, but with at least some of said new electrical interconnect exposed at a bottom of at least one well having sidewalls; and wherein said sidewalls of said at least one well are activated and a connection provided between said at least two layers.

9. The apparatus of claim 8 wherein said at least one interconnect comprises a horizontal interconnect.

10. The apparatus of claim 8 wherein said at least one interconnect comprises a vertical interconnect.

11. The apparatus of claim 8 wherein said at least one interconnect comprises a horizontal interconnect and a vertical interconnect.

12. The apparatus of claim 8 wherein said structure comprises a dielectric structure.

13. The apparatus of claim 8 wherein said connection between said at least two layers is provided after a subsequent electroless plating operation.

14. The apparatus of claim 8 wherein activation of said sidewalls of said at least one well, comprises: activation of said sidewalls of said at least one well with said laser.

15. A three-dimensional electronic or electromechanical apparatus, comprising: at least two layers of a three-dimensional substrate of a structure activated by a laser, said at least two layers created with a 3D printer; a horizontal and vertical interconnect selectively activated using traces of said horizontal and vertical interconnect by said laser with respect to said structure; a new electrical interconnect that is highly conductive and densely routed, said new electrical interconnect provided by electrolessly plating said structure, wherein said structure is re-inserted with registration into said 3D printer; an additional dielectric deposited with a majority of said new electrical interconnect covered and embedded, but with at least some of said new electrical interconnect exposed at a bottom of at least one well having sidewalls; and wherein said sidewalls of said at least one well are activated and a connection provided between said at least two layers.

16. The apparatus of claim 15 wherein said structure comprises a dielectric structure.

17. The apparatus of claim 15 wherein said connection between said at least two layers is provided after a subsequent electroless plating operation.

18. The apparatus of claim 15 wherein activation of said sidewalls of said at least one well, comprises: activation of said sidewalls of said at least one well with said laser.

19. The apparatus of claim 15 wherein said structure comprises a dielectric structure and wherein said connection between said at least two layers is provided after a subsequent electroless plating operation.

20. The apparatus of claim 19 wherein activation of said sidewalls of said at least one well, comprises: activation of said sidewalls side of said at least one well with said laser.

* * * * *